United States Patent [19] [11] 3,985,635
Adam et al. [45] Oct. 12, 1976

[54] APPARATUS FOR CONCURRENTLY SPUTTERING DIFFERENT MATERIALS

[75] Inventors: Helmut Adam; Hans Lutz, both of Stuttgart; Gert Siegle, Hildesheim, all of Germany

[73] Assignee: Robert Bosch G.m.b.H., Stuttgart, Germany

[22] Filed: Feb. 1, 1974

[21] Appl. No.: 438,792

[30] Foreign Application Priority Data
Feb. 16, 1973 Germany............................ 2307649

[52] U.S. Cl................................. 204/298; 204/192
[51] Int. Cl.²......................................... C23C 15/00
[58] Field of Search............................ 204/298, 192

[56] References Cited
UNITED STATES PATENTS

| 3,324,019 | 6/1967 | Laegreid et al. | 204/298 |
| 3,361,659 | 1/1968 | Bertelsen | 204/298 |
| 3,652,444 | 2/1972 | Lester et al. | 204/298 |

OTHER PUBLICATIONS
Kay et al, "Controlled Sputtering Process", IBM Technical Disclosure Bulletin, vol. 12, No. 9, Feb. 1970, p. 1358.
Hanak, "Compositional Determination of rf Co-Spattered Multicomponent Systems", J. of Vac. Sci. and Tech., vol. 8, No. 1 (Jan–Feb. 1971, pp. 172–175).

Primary Examiner—Oscar R. Vertiz
Assistant Examiner—Wayne A. Langel
Attorney, Agent, or Firm—Flynn & Frishauf

[57] ABSTRACT

Separator shields are provided between the substrates subject to sputtering and the boundaries between cathodes or between portions of the cathodes exposing different materials to be sputtered by a glow discharge. The shields extend to a few millimeters' spacing from the cathode and are at a potential at or near ground potential within ± 50 volts of the potential of the substrates. A common rear and side shield and a common electrical feed-through connection is provided for the cathode structure or cathodes. The substrates may be passed repeatedly through the sputtering zone or, in a circular configuration, can be moved in a circular path, so as to facilitate alloy-type coatings by producing very thin layers in alternation. The shielding reduces masking of one material by another on the cathode by cross-sputtering, thereby maintaining close to constancy the sputtering rates of the different materials for up to several hundred hours of operation. The cathode base plate of a composite cathode can be repeatedly used in successive operations with new material to be sputtered.

6 Claims, 5 Drawing Figures

APPARATUS FOR CONCURRENTLY SPUTTERING DIFFERENT MATERIALS

This invention relates to apparatus for concurrent sputtering of different materials, especially of coppor and iron.

Usually, only thin layers of a single material are produced by sputtering in a glow discharge at low gas pressure. If it is sought to produce layers of a number of different substances or of alloys composed of the individual components by the sputtering of corresponding cathode materials in an evacuated vessel, mutual sputtering of the different cathodes can take place, regardless of whether voltage if applied to all or to only one of the cathodes, that is, regardless if whether all or only one of the cathodes are caused to act as a source of sputtering. In this way, after a few minutes to hours, the surfaces of the cathodes are so changed that the sputtering rates are changed, and in consequence when the sputtering parameters are held constant, among them the gas pressure, cathode voltage and sputtering time, the properties of the layers produced on substrates in the neighborhood of the cathodes undergo changes.

Among the known kinds of apparatus for sputtering different materials there are both apparatus with a number of separate cathodes and also apparatus with a common cathode on which the different materials are spread one beside the other. When sputtering of different materials is carried out with the last-mentioned arrangement, with a common cathode, particularly in experimental apparatus, the operation suffers from a number of disadvantages, particularly if a unitary alloy layer is to be produced. Among these disadvantages there are notably, first, the formation of cones on the material more readily sputtered and, second, the increase of the current density at the cathode less readily sputtered, at the expense of the current density on the cathode more readily sputtered. Cone formation takes place because the particles of the material more difficult to sputter are deposited on the material more readily sputtered and interfere with the sputtering of the latter. The composition of the sputtered layer is consequently varied as the cones form.

It is an object of the invention to make possible the simultaneous sputtering of a number of cathode materials in a gas discharge while, sofar as possible, suppressing the sputtering of material from one cathode segment onto the other or others. It is a further object of the invention to provide apparatus for thus sputtering different materials simultaneously in such a way that the space occupied by the cathode structure and its shielding will be as small as possible so that the apparatus as a whole may be reasonably short in all dimensions.

SUBJECT MATTER OF THE PRESENT INVENTION

Briefly, electrically conducting shielding means are arranged in the region between the substrates to be sputtered and the boundaries between the adjacent segments of different materials connected together as the cathode in the sputtering vessel. The different materials are provided in different areas on a common cathode. Preferably, the cathode is substantially surrounded, on all sides except the side facing the substrates to be sputtered, by an electrically conducting shield, preferably grounded.

A particularly advantageous form of the invention utilizes a common cathode base plate capable of repeated use in successive operations with new facings of cathode materials to be sputtered.

The shielding means extending in the region between the boundaries between different cathode materials and the substrates can conveniently be electrically conducting sheet metal separators that are electrically grounded. For long life, the separator shields are advantageously made of a material difficult to vaporize, preferably stainless steel. In order to prevent the occurrence of electrical breakdown discharges between the cathode and the separator shields, the separator shields are disposed so that they extend very close to the surface of the cathode, having a gap of at most only precisely a few millimeters. The most favorable distance depends, on the one hand, on the requirement of providing the smallest possible deposition of sputtered material of one kind on the cathode surfaces of another kind of material and, on the other hand, on the well-known Paschen law, under which, corresponding to the degree of evacuation in the vacuum vessel, the risk of breakdown between differently polarized electrodes is small (the smaller, the higher the vacuum) even at very small distances.

The invention is further described by way of example with reference to the accompanying drawings, in which.

Figure 1:
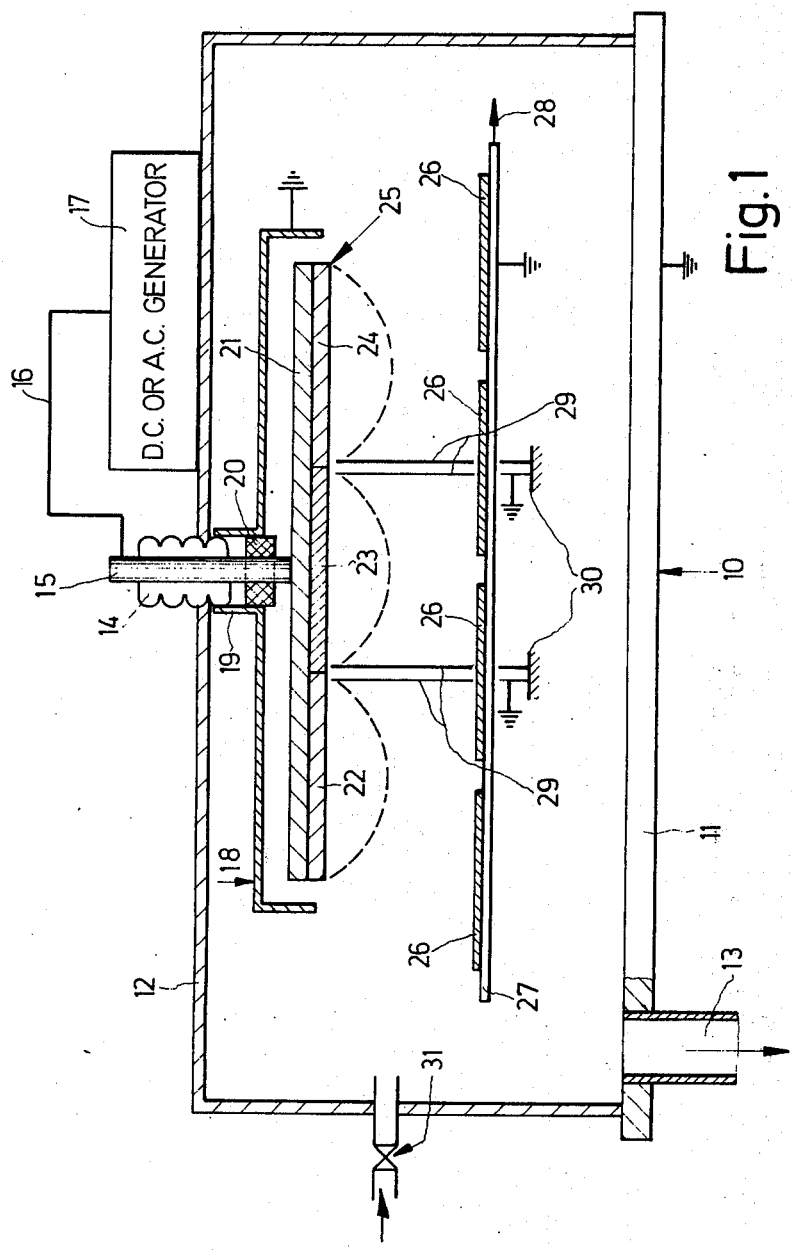
FIG. 1 is a schematic longitudinal cross-section of a sputtering apparatus for continuous operation.

FIG. 1 shows a sputtering vessel 10 having a base plate 11 and a hood 12. An outlet 13 is provided in the base plate 11 for connection to a vacuum pump not shown in the drawing. A tube provided with an inlet valve 31 for admitting the sputtering gas is sealed to the hood. The gas, the ions of which bombard the cathode in the glow discharge and thus cause sputtering of the cathode material, may, for example, be argon.

An insulator 14 is sealed in the hood 12 through which a feed-through connection 15 penetrates in a vacuum type fashion to the interior of the sputtering vessel. The feed-through lead 15 is provided with an electrical connection 16 for application of a d.c. or high frequency voltage from the generator 17.

The lower part of the insulator 14 is surrounded by the upper end of the neck portion 19 of the shield 18 which covers the back side and edge surfaces of a cathode base plate 21 which is mechanically and electrically connected with the feed-through lead 15, which is further centered in the neck portion 19 of the shield 18 by means of an insulating plug 20.

The surface of the cathode base plate 21 opposite to its connection to the lead 15 is its front surface and there the different materials to be sputtered are affixed, for example, by screws not shown in the drawing. The different materials are respectively designated 22, 23 and 24 in FIG. 1. In this illustrative embodiment the material 22 is copper, the material 23 iron and the material 24 again copper. The shield 18 is grounded. The cathode base plate 21 and the materials 22, 23 and 24 fastened to it form a common composite cathode 25.

The substrates on which the sputtered material is to be deposited are designated 26 and rest on a substrate carrier 27 which, in the illustrative embodiment shown in FIG. 1, is movable in the direction designated by an arrow 28. The substrates 26 are grounded through the substrate carrier 27.

Between the plane in which the exposed substrate surfaces lie and the cathode 25, shielding means are provided aligned along the boundary lines between the different materials 22, 23 and 23, 24. As shown in FIG. 1, the shielding means are in the form of double separator walls 29, of sheet metal, and, like the shield 18, grounded. The separator shields 29 consist of a material that does not readily vaporize, preferably stainless steel, and they extend very close to the surface of the cathode 25, up to a few millimeters. In this illustrative embodiment, the separator shields 29 straddle and extend around the substrates in U-shape, with the legs of the U mechanically fastened at the points 30. They are held electrically to ground potential or to a potential that does not deviate by more than ± 50 volts from the potential of the substrates.

In a sputtering apparatus according to this invention, therefore, the different cathode materials are not constituted as separate cathodes electrically insulated from each other, with separate shielding and separate electrical connections through the vessel, but, in contrast, are assembled together in usually adjacent fashion to provide one large composite cathode, for example, by fastening the different materials one beside the other on the cathode base plate 21 and the composite cathode is surrounded by a single back and side shield 18. The mutual depositing of sputtered material on each other by the different parts of the cathode is reduced by the separator shields 29 that are preferably grounded, The elimination of this troublesome effect is sufficient to make possible sputtering operations, lasting more than several hundred hours, with less than a typical 10% tolerance of variation of the relative thickness of successive layers produced by a single pass of a substrate 26 beneath the cathode. The double wall configuration of the separator shields 29 still further reduces the remaining deposition of sputtered material by the cathode portions on each other, as compared with the arrangement with single separator shields.

The formation of cones on the more readily sputtered material — in this illustrative embodiment copper — and the increase of the current intensity on the cathode material which is more difficult to sputter — in this illustrative embodiment iron — at the expense of the other material, is limited to such a low rate in the apparatus according to the invention that the abovementioned long periods of sputtering operation with steady results are made possible. Without separator shields, on the other hand, the composition of the layers produced by sputtering from such a copper-iron cathode having two 10 × 10 cm$^2$ surfaces of copper and iron, respectively, changes already after about 10 hours in such a way that the sputtering rate of the copper can decrease by the factor of two in a d.c. discharge. The apparatus above-described can be used for sputtering equipment of the so-called diode type or of the so-called triode or tetrode types, for either d.c. or a.c. discharges.

It is known that cathodes intensively bombarded by ions in a gas discharge are pulverized on the surface, causing the particles to be sputtered out of the material to precipitate or deposit a thin layer on objects in the neighborhood of the cathode. From this known fact has resulted the possibility to produce thin layers in practical technology by cathode sputtering. The introduction of cathodic sputtering into industrial practice has suceeded particularly for the production of electrical resistors in the form of thin metallic conducting layers and for the provision of insulating and passivating layers on semiconductor devices. The number of practical applications is continually rising and layers can be produced by this technique out of nearly all substances — metals, insulators, semiconductors, alloys, mixtures of metals and insulators, ferroelectric and even highpolymer materials — with high purity, density, cohesion and adhesion. In the illustrative embodiment described, only the sputtering of metals in a so-called diode apparatus was illustrated, without any intention to infer that the application of the invention is limited to this type of apparatus.

The diode type represents the simplest apparatus for production of thin layers by cathodic sputtering. In this case, the object to be metalized, the so-called substrate 26 located in the sputtering vessel 10, is placed at a distance of a few centimeters from a plate of the material or material 22–24, of which the layer is to consist. This plate, the cathode 25, is subsequently switched to a negative voltage of a few kV, as a rule about 3 to 8 kV, with respect to the rest of the apparatus, making it electrically the cathode. Beforehand, however, the apparatus is first evacuated at least to the extent of producing a pressure as low as $10^{-4}$ torr, after which gas, preferably argon, is admitted through a control valve 31 until the pressure rises to about $10^{-2}$ torr. Then the cathode voltage is switched on and a glow discharge ignited. With the commonly used argon filling, the discharge glows with an intense violet color. The boundary of the discharge is indicated by dashed line in FIG. 1. This dashed line represents the boundary of the dark space of the discharge. The pressure and the distance between the cathode 25 and the substrates 26 are so selected that the boundary of the dark space is at least some little distance in front of the substrates. The sputtering rate corresponds with the shape of the dark space boundary, i.e., in the middle of the individual parts of the cathode surface separated by the separator shields 29 the sputtering of the cathode material is at its greatest and the sputtering rate drops to about 0 at the edges of these portions of the cathode in the regions of the separator shields 29.

In order to limit the sputtering of the cathode 25 to the side of the cathode facing the substrates 26, the other side of the cathode 25 is surrounded by a grounded shield 18 which is provided at a spacing from the cathode that is smaller than the dark space spacing. Consequently, no plasma can be formed between the cathode 25 and the shield 18; ion current and sputtering are therefore impossible in these regions.

Since for a particular combination of cathode material and sputtering ions, the sputtering rate is independent within certain limits of the cathode temperature, the cathode 25 can be cooled without substantial sacrifice of rate of deposit.

The know cathode sputtering apparatus operate either with a self-supporting or a nonself-supporting discharge. In the first case, the product of the gas pressure and the cathode-anode spacing is so great that a plasma can be formed. Since in the simplest case it is enough to have a cathode and an anode to produce a discharge, this is commonly referred to as the diode design, as shown in the drawing. In the second case, the product of gas pressure and spacing between cathode and anode is significantly smaller, so that no self-supporting discharge can arise and the sputtering gas must be artificially ionized. For this purpose, a supplementary electron current is caused to flow from a glow discharge cathode through the gas to an auxiliary anode. The material to be sputtered is again placed at a negative potential with respect to the remainder of the apparatus. The ions accelerated to the cathode bombard the latter and cause sputtering and the atoms thus set free condense on the substrate. Because of the presence of the supplementary electrodes, the glow cathode and the auxiliary anode, apparatus of this type is also given the name of triode or tetrode apparatus. The invention is also applicable with success to these types of apparatus, but description and explanation of such application in detail can be dispensed with, because in principle nothing is changed from the operations above-described. Diode types are preferably installed for the production of layers of metals, alloys, nitrides and oxides, whereas triodes, on the other hand, are preferred for the production of layers of semiconductors, superconductors or also of metals and alloys. For the same cathode-substrate spacings, the diode requires a gas pressure one or two orders of magnitude higher than in the triode. Consequently, the layers produced with triode apparatus have less trapped gas and they are in consequence more dense and more pure than layers produced by diode apparatus. Conversely, the collisions of the sputtered atoms in the sputtering gas in the diode apparatus offer the possibility of reactive sputtering, i.e., the sputtering of oxides, nitrides and carbides in spite of metallic cathodes.

The apparatus can contain a cathode either for d.c. or high-frequency a.c. excitation. For industrial installation of cathode sputtering apparatus, the diode design is preferably selected because of the simple construction that has little susceptibility to disturbance and provides good constancy of layer thickness even over larger surfaces.

At the edges of the cathode 25 or of the cathode portions, or at the edges of the substrate 26, the density, impedance and extension of the plasma changes, for which reason at these locations the sputtering and deposit rates are not the same as in the center of the individual cathode portions or of the substrate surfaces. If the cathodes are made greater than the substrates, or if the substrates are moved along under the cathodes, results are obtained that are independent of the edge effects of the cathodes or of the cathode portions.

As already mentioned, the separator shields 29 have the effect of reducing the formation of cones on the more readily sputtered materials of the cathode 25, in the example given on the copper in the cathode regions 22 and 24. By the sputtering, a portion of the atoms are scattered by the gas atoms and can thus return to the cathode. Thus, with a cathode composed of different metals, atoms of one metal can reach portions of the cathode made of the other metal. If one metal sputters significantly more easily than the other, after prolonged sputtering, ions of the metal more difficult to sputter can be formed on the metal more readily sputtered, which ions impede the sputtering of the latter metal. On the vertices of the cones so formed, the metal more difficult to be sputtered is readily recognizable chemically and, with suitable dyeing, it is often also visible in a microscope.

The main advantages of the apparatus of the present invention are, first, that the construction of the apparatus is very simple; second, that its long dimension, compared to apparatus with separate disposition of cathodes for different materials is reduced by 20%, with the the further advantages that cooling, current supply, mechanical mounting and shielding is necessary only for one cathode.

Even though cathode 25 does not sputter in the immediate neighborhood of the separator shields 29, where the separator shields come close to the cathode, a substantial shortening of the apparatus can still be obtained.

Figure 2A:
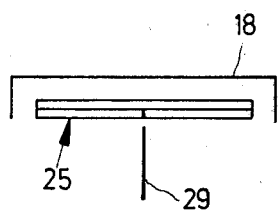
FIGS. 2a, 2b and 2c are schematic diagrams of a dual cathode with differently constituted separator shields.
Figure 2B:
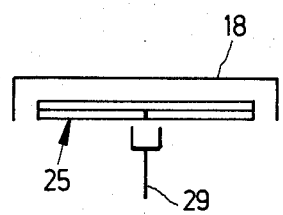
Figure 2C:
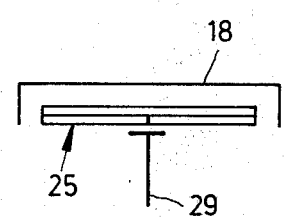

FIG. 2 shows three different forms of the edges of the separator shields at the boundaries of the different cathode materials to be sputtered, these forms being alternative for single wall separators that may be used instead of the double wall separators shown in FIG. 1. In FIG. 2a a plain normal separator shield is shown. In FIG. 2b a labyrinth-like form of edge is shown which has proved particularly useful in practice. FIG. 2c shows a T-shaped edge on the separator shield along the cathode. This last form likewise very effectively reduces the mutual sputtering of the cathode portions.

Figure 3:
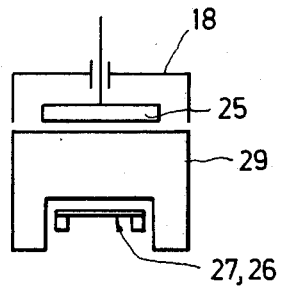
FIG. 3 is a diagrammatic side view of a sputtering apparatus with one separator shield, the vacuum vessel and electrical connections being omitted.

FIG. 3 is a diagrammatic side view of a sputtering apparatus according to the invention, from which it is clear how the U-shaped lower portion of the separator shield 29 straddles the substrate.

In addition to the embodiments already illustrated, sputtering apparatus embodying the invention can also be equipped with a circular cathode and, particularly in the case of a circular cathodes, the substrates can be moved around below the cathode in a circle.

If the formation of an alloy between the materials of the deposited layers is to be produced, either the substrates are quickly and repeatedly passed through the regions under the various cathode materials, or else the separator shields are arranged to end several millimeters to a centimeter or two short of the substrates. The different materials will then be sputtered into each other and will form an alloy or an aggregate.

We claim:
1. Apparatus for concurrent sputtering of different materials, comprising:
a vessel capable of being evacuated and provided with means for evacuation and for admitting a small quantity of a gas for sustaining a glow discharge;
means, including a common anode electrode, for supporting a plurality of substrates (26) to be sputter-coated;
a single composite cathode (25) formed of portions of materials (22, 23, 24) of different compositions respectively having surfaces in which each of said materials is exposed to a glow discharge during operation of said apparatus;
means for applying cathodic potential to said cathode with respect to said substrates, so as to cause said materials to be simultaneously sputtered in a single glow discharge;
electrically conducting first stainless steel sheet metal shielding means (29) extending to within a few millimeters of the surfaces of said cathode (25) and spaced sufficiently to prevent electrical breakdown for preventing sputtering of one cathode material on a surface of the cathode consisting of another material, said shielding means being disposed in front of the cathode substantially perpendicularly to the surfaces of the cathode (25) and of the substrates (26) and being substantially aligned with the mutual boundaries of said exposed materials of different compositions of the cathode, and second shielding means (18) connected electrically to said first shielding means and to ground potential and substantially enclosing the totality of said portions of said materials except on the side where they face said substrates (26).

2. Apparatus as defined in claim 1 in which said exposed materials (22, 23, 24) are affixed to an electrically conductive cathode base plate (21) which is repeatedly usable in successive operations with new materials to be sputtered.

3. Apparatus as defined in claim 1 in which said first shielding means (29) laterally straddle said substrates.

4. Apparatus as defined in claim 1 in which said first shielding means (29) are mechanically connected to said second shielding means (18).

5. Apparatus as defined in claim 1 in which at least one of said first shielding means (29) reaches almost to said second shielding means (18).

6. Apparatus as defined in claim 1 in which said supporting means is movable in a direction transverse to said mutual boundaries of the different materials of the cathode exposed to a glow discharge, whereby substrates may be successively exposed to sputtering of each of said materials to form a succession of sputtered layers thereon.

* * * * *